July 20, 1965 S. T. ENG 3,196,328

LOW NOISE MICROWAVE MIXER DIODE

Filed Feb. 28, 1962 3 Sheets-Sheet 1

INVENTOR.
SVERRE T. ENG,
BY
W H MacAllister Jr
ATTORNEY.

LOW NOISE MICROWAVE MIXER DIODE

Filed Feb. 28, 1962 3 Sheets-Sheet 2

INVENTOR.
SVERRE T. ENG,

BY

Wallace Allister Jr
ATTORNEY

LOW NOISE MICROWAVE MIXER DIODE

Filed Feb. 28, 1962 3 Sheets-Sheet 3

INVENTOR.
SVERRE T. ENG,
BY
W. H. MacAllister Jr.
ATTORNEY.

3,196,328

LOW NOISE MICROWAVE MIXER DIODE

Sverre T. Eng, Tustin, Calif., assignor to Hughes Aircraft Company, Culver City, Calif., a corporation of Delaware Filed Feb. 28, 1962, Ser. No. 176,313
2 Claims. (Cl. 317—234)

This invention relates to frequency mixing devices and particularly those employed to mix electromagnetic energy of microwave frequencies to produce an intermediate frequency signal in the audio range. More particularly, the invention relates to a semiconductor device for mixing microwave frequency signals to produce an intermediate frequency signal.

In certain navigational system such as Doppler radar systems, transmitted and reflected microwave signals are mixed to produce an intermediate frequency signal representative of the Doppler "beat" or difference. This intermediate frequency signal is in the audio range and is extremely subject to interference from electrical diode noise, particularly noise hereinafter described in greater detail as "*l/f* noise." While such noise may be substantially reduced or avoided by utilization of a higher intermediate frequency signal level (i.e., 30 mc., the complexity of such higher IF systems increases and results in a sacrifice of light weight and small size.

It will be appreciated that the interference from such noise in Doppler radar systems is a critical factor and can render the system useless or excessively inaccurate. Heretofore, the semiconductor devices employed for microwave frequency mixing in such systems to achieve the weight and size advantages thereof have a noise figure of about 39 db with a 13.5 K mc., input frequency and a 1 kc. intermediate frequency. These prior art microwave diodes are of the point contact type utilizing N-type germanium. The best silicon diodes investigated heretofore for use as such a mixer have a noise figure of 40 db. While theoretically the lowest possible *l/f* noise might be attained with a P-N junction diode, the conversion loss of such diodes for frequency mixing purposes at microwave frequencies was excessive, that is, a signal power loss of greater than 15 db is characteristic of junction diodes previously investigated. The high conversion loss of junction diodes is known to be principally due to the junction capacitance which could not heretofore be successfully minimized to an acceptable value. The high junction capacitance is caused by, or at least severely aggravated by the necessity of employing low resistivity semiconductor material which is necessary for the operation at microwave frequencies.

In explaining the solution to the problem of providing a low noise microwave mixer diode having an acceptable conversion loss, it will be helpful to review briefly the noise characteristics of semiconductor devices. In general there are three basic types of noise which occur in semiconductor devices. The first is "thermal" noise caused by the random motion of electrons. The second noise type is "shot" noise which results when a drift velocity is superimposed by means of an electric field. The third noise type, which is by far the most troublesome to control since its origin is not precisely known, is *l/f* noise which is detected over and above both themal and shot noise and which is distinguished by its spectral intensity. Experiments and investigations by others have indicated that the degree of electrical activity of the surface of the semiconductor body itself plays a significant part in connection with *l/f* noise. Hence one approach for decreasing this noise has been to stabilize the surface by such procedures as etching the surface, controlling the ambient gas thereabout, and by providing thermally grown oxide layers.

The present invention is based at least in part upon the fact that N-type silicon has been found to be inherently capable of providing a microwave frequency mixer diode having the lowest attainable *l/f* noise figure and that a P-type region can be provided in an N-type body of silicon with an acceptably low junction capacitance, whereby a *l/f* noise figure of less than 25 db and a conversion loss of less than 7 db can be achieved at 13.5K mc. input frequency and a 1 kc, intermediate frequency. These characteristics of the mixer diode of the present invention represent a substantial advance over the mixer diodes heretofore employed. These characteristics are all the more remarkable when it is considered that the mixer diodes used in Doppler radar systems for the past 15 years have not changed substantially during that time and the *l/f* noise figure thereof has only been improved to the extent of about 8 or 9 db down to the present level of about 38 db during this time.

In addition to the improvement resulting from the utilization of N-type silicon and the provision of an extremely low junction capacitance, the mixer diode of the present invention also achieves its excellent characteristics according to the invention by the attainment of an extremely good electrical connection between the P-type region of the diode and the lead wire therefor. This gives a volt-ampere characteristic with lower reverse current and a higher forward resistive non-linearity than conventional point contact diodes employed heretofore for microwave frequency mixing purposes. Also, by the proper use of surface etching treatments, the *l/f* noise figure may be further optimized by about 1–2 db.

The invention will be described in greater detail by reference to the drawings in which.

Figure 1:
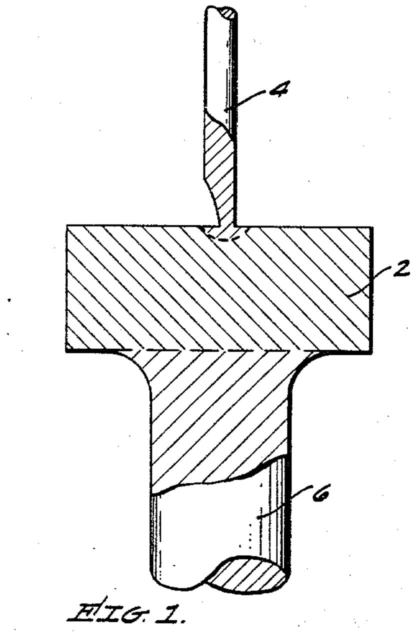
FIGURE 1 is an elevational view in section of a microwave mixer diode in accordance with the inventon.

Referring now to the drawings, a microwave mixer diode according to the invention is shown comprising an N-type silicon wafer 2, preferably single crystalline, an acceptor-doped electrode 4 bond to and in rectifying relationship with the wafer, and a non-rectifying electrode 6 connected to a different portion of the wafer.

The N-type wafer 2 which may be about 5 mil thick, for example is provided by slicing and dicing an ingot in single crystalline form of silicon which has been doped by conventional techinques with a donor or N-type impurity such as arsenic. In order to enhance operation of the device at microwave frequencies, the resistivity of the N-type silicon wafer 2 is between 0.01 and 0.020 ohm-centimeter.

nig a low noise microwave mixer diode having an ac-
of 40 db. While theoretically the lowest possible *l/*
briefly the noise characteristics of semiconductor de- The whisker or electrode 4 consists essentially of a gold-gallium alloy wire, the amount of gallium being about 1% by weight. The electrode 4 may have a typical diameter of 1.5 mils and, as suggested by the drawings, is pointed on the end which is bonded to the N-type silicon wafer by an electrical pulsing technique which will be described in greater detail hereinafter. The electrode 6 may be a wire of any good electrically conductive material which can be soldered or otherwise secured to the silicon wafer 2 so as to provide a non-rectifying connection thereto. Thus, the electrode 6 may be a wire or brass pin, for example, which is soldered to the wafer 2 by a gold solder which may contain a donor material to insure the attainment of a non-rectifying connection. In some instances it may be desirable to utilize a solder preform to make this ohmic connection, the preform comprising a plating of gold or gold-antimony alloy.

Figure 3:
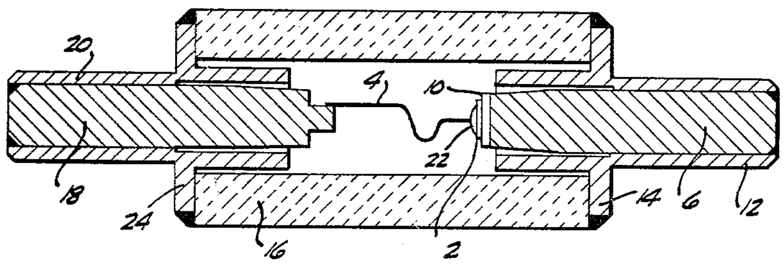
FIGURE 3 is an elevational view partly in section of a microwave mixer diode in accordance with the invention and the container therefor.

Referring now to FIGURE 3, the silicon wafer 2 is shown connected to a stud type lead member 6. In particular the silicon wafer 2 may be soldered to the stud member 6 by means of a preform 10 comprising a 6 mil molybdenum substrate having a first plating of gold thereon (about 1 mil thick), and a second plating or flashing of antimony over the gold (about 0.2 mil thick). The stud member 6 is contained within a metallic tube 12 and is hermetically soldered or bonded thereto. The metallic tube 12, which may be of gold-plated brass, for example, is provided with a collar or flange portion 14 adapted to engage the ends of a ceramic sleeve 16 and to be hermetically sealed thereto so that the silicon crystal 2 and the end of the stud member 6 on which the crystal wafer is mounted are contained within the space defined by the ceramic sleeve 16. The sealing of the collar portion 14 to the ceramic body may be accomplished by conventional techniques for bonding metallic bodies to ceramic articles. In general, this technique involves the metalization of the ends of the ceramic sleeve 16 with a mixture of molybdenum and manganese so as to provide a metallized surface to which bonds by brazing or soldering may be readily achieved. In some instances it may be desirable to place the metalized portions of the ceramic sleeve 16 with nickel so as to facilitate the use of solder for the hermetic sealing thereto.

Disposed in the opposite end of the ceramic sleeve 16 is a similar type stud member 18 and flanged metallic tube 20 which is adapted to be hermetically sealed to the end of the ceramic sleeve in the manner just described. The end of the stud member 18 which extends into the interior of the ceramic sleeve 16 has a reduced diameter portion to which is welded the gold gallium whisker.

In assembly, the crystal 2 is mounted onto the stud member 6. A small drop of epoxy resin may then be applied to the surface of the crystal 2 in accordance with the teachings of the co-pending patent application of W. P. Waters and R. R. August, entitled "Semiconductor Device and Methods Therefor," Serial No. 142,346, filed October 2, 1961. The crystal carrying stud member 6 and the whisker-carrying stud member 18 are then inserted into the flanged tubular members 12 and 20, respectively, the whisker 4 making contact with the crystal 2 through the epoxy resin material 22.

Figure 5:
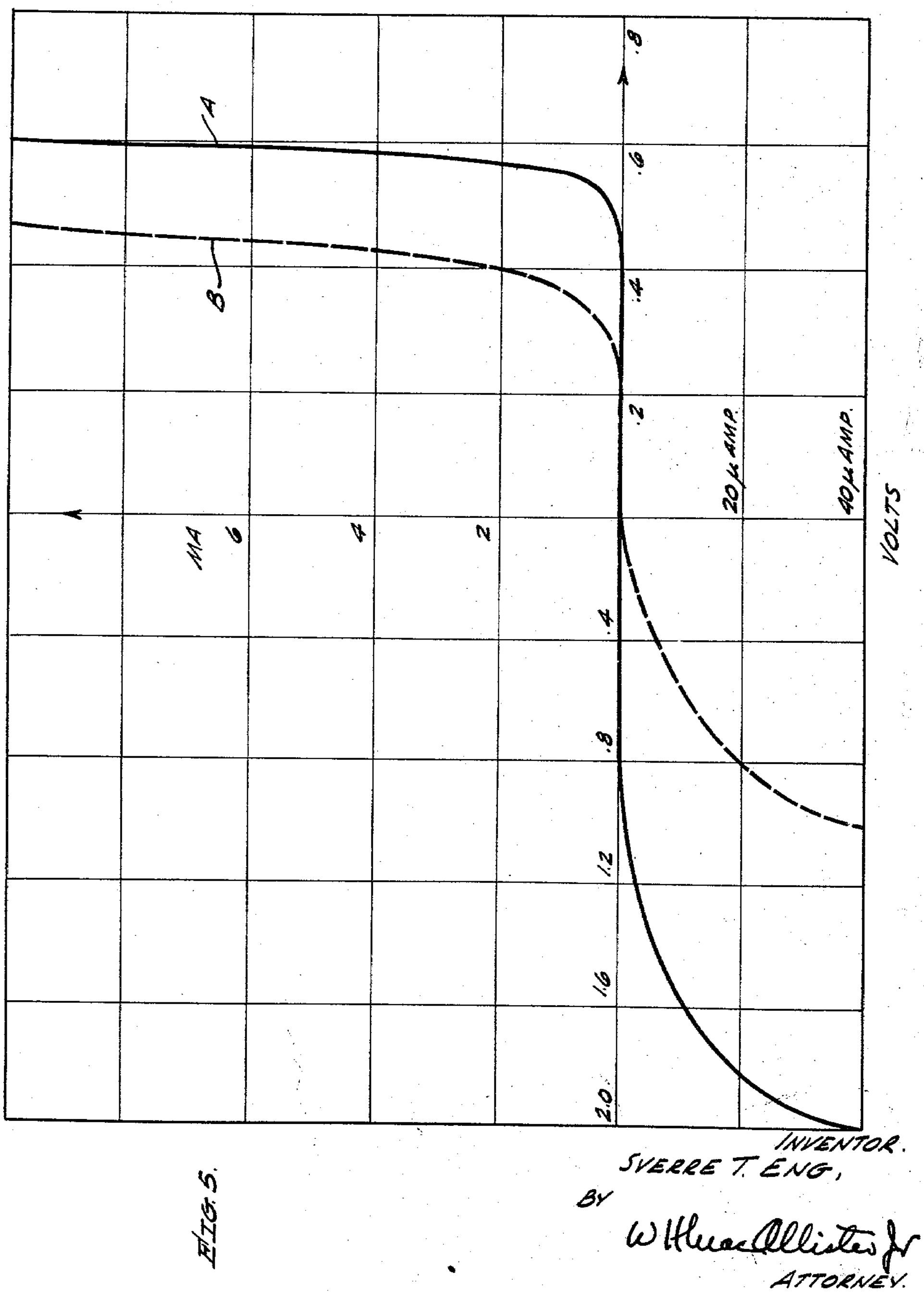
FIGURE 5 is a graph comparing the current-voltage (I-V) characteristic of mixer diodes of the prior art and of the mixer diode according to the present invention.

Thereafter pulses of between 6 and 35 volts and from 40 to 300 milliamperes and of millisecond duration, for example, about 7–50 milliseconds, are applied one at a time until a voltage-amperage characteristic corresponding to that shown by Curve A in FIGURE 5 is obtained. As is well-known, the voltage-amperage characteristic is displayed on an oscilloscope during pulsing where it may be observed. The final step in the operation is to solder the stud members 6 and 18, respectively, to the tubular members 12 and 20 and to solder the flanged portions 14 and 24 of the stud members to the ceramic envelope 16.

Figure 2:
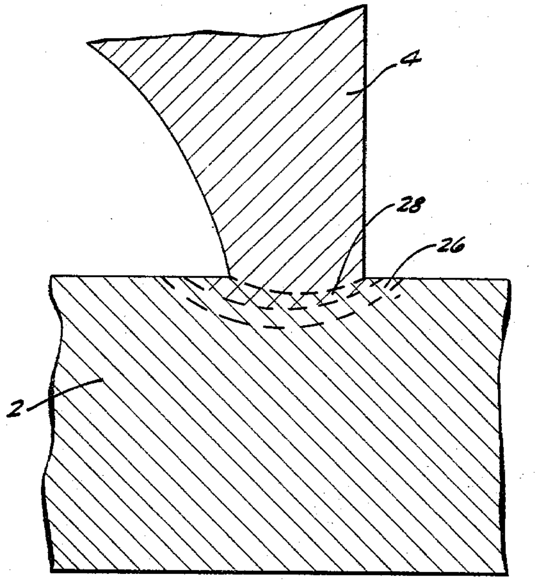
FIGURE 2 is a cross-sectional elevational view of the lead wire and junction region of the mixer diode shown in FIGURE 1.

With particular reference to FIGURES 1 and 2, this pulsing procedure achieves a fusion of the whisker 4 to surface and near-surface portions of the silicon wafer 2. By pulsing, sufficient heat is generated at the contact region between the whisker 4 and the silicon wafer 2 to result in the momentary formation of a liquid alloy phase of the materials of the whisker and the silicon crystal. Upon the termination of the pulsing, the temperature decreases and the liquid solution solidifies to form a gallium doped P-type region 26 in rectifying relationship with the N-type silicon crystal body, and a silicon-gold eutectic region 28 which is fused to and ohmically connected to the P-type region 26 and the unmelted tip of the whisker 4. The P-type region 26 is a regrowth region, that is, it is a single crystalline extension or continuation of the crystal structure of the silicon body 2. By this method a rectifying contact to the silicon wafer is provided having a capacitance less than 0.15 micromicrofarad with a volt-ampere characteristic as shown in FIGURE 5. By obtaining such a small junction and contact capacitance to the relatively low resistivity silicon body, the conversion loss of the diode thus produced is less than 7 db at 13.5K mc. input frequency and 1 kc. intermediate frequency.

Figure 4:
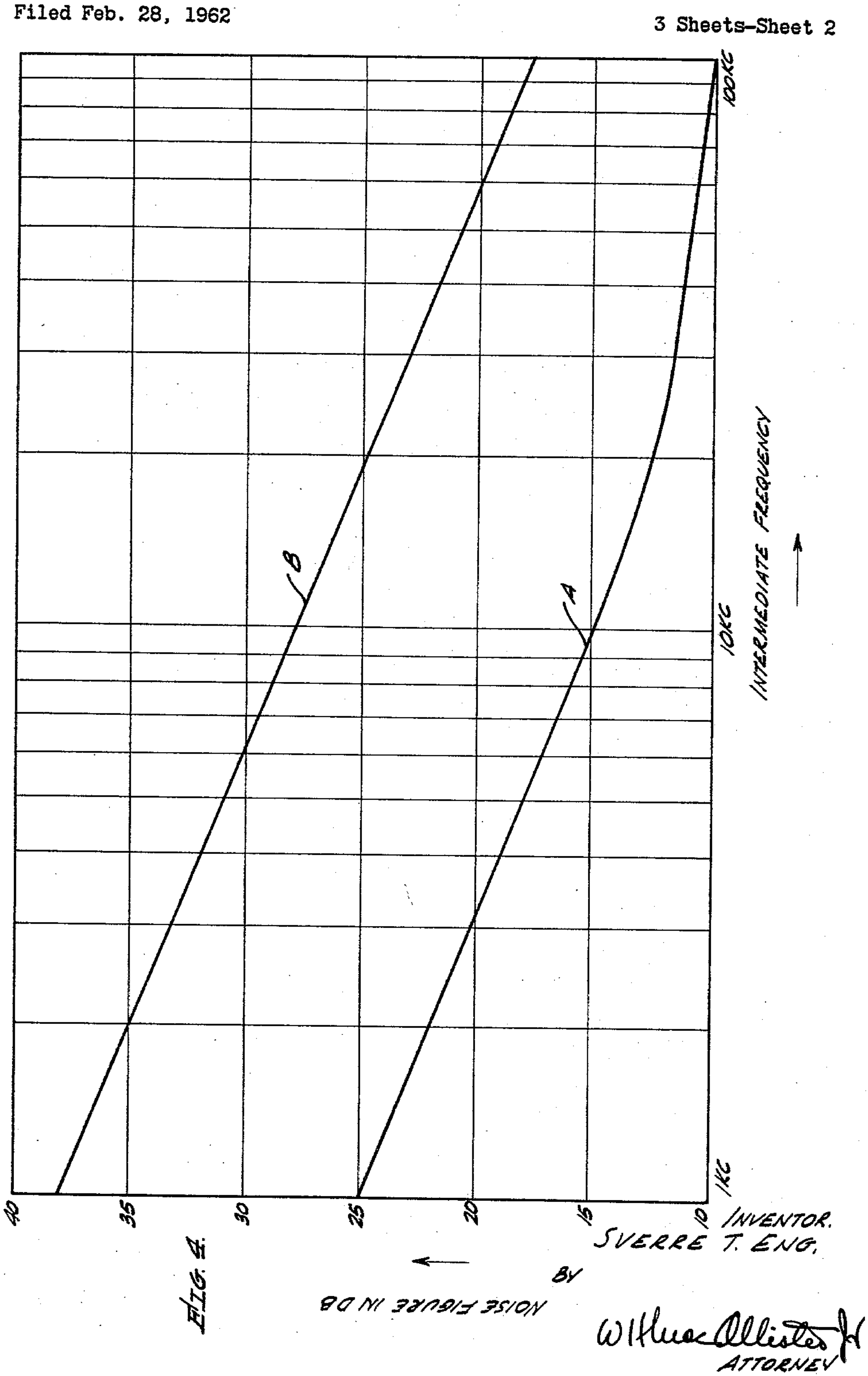
FIGURE 4 is a graph comparing typical *l/f* noise figures at different frequencies for mixer diodes of the prior art and for the mixer diode according to the present invention.

In FIGURE 4 the noise figure of diodes prepared according to the present invention and those heretofore obtainable are plotted against frequency. Curve A represents the noise-vs.-frequency characteristic of a diode manufactured in accordance with the present invention, while Curve B represents the noise-vs.-frequency characteristic of a previously available mixer diode. It will be noted that diodes according to the present invention have a substantially lower noise figure than the diodes represented by Curve B. In particular, at a frequency of one kilocycle a diode according to the present invention has a noise figure about 13 db lower than the best mixer diode previously available.

Referring now to FIGURE 5, the voltage-current characteristics of a diode manufactured according to the present invention and the mixer diodes (which were of the point-contact type) heretofore available are shown. Curve A represents the current-voltage characteristic of a diode according to the present invention, while Curve B represents the current-voltage characteristic of the best prior art mixer diode. It will be appreciated that Curve B is typical of a point-contact characteristic and that Curve A is typical of a junction-type device. In particular, diodes manufactured according to the present invention have a reverse current of less than one microampere at a voltage of about one volt and a much higher forward resistive non-linearity than the diodes of Curve B.

There thus has been described a diode capable of operation at microwave frequencies through the use of low resistivity semiconductor material which operates at a much lower noise figure than heretofore obtainable and with acceptably low conversion loss when utilized for frequency mixing purposes.

What is claimed is:

1. A microwave frequency semiconductor device comprising an electrically-insulating envelope, a pair of lead members coaxially disposed in the opposite ends of said envelope, a body of N-type silicon having a resistivity of between 0.01 and 0.020 ohm-centimeter mounted to one of said lead members and in non-rectifying relationship therewith, a whisker of gold-gallium alloy comprising substantially 1% by weight of gallium secured to the other of said lead members and fused to the surface of said N-type silicon body forming a joint comprising a silicon-gold eutectic region and an underlying P-type region, said joint comprising means for producing a capacitive PN-junction between said P-type region and said N-type silicon body of a value less than 0.15 micromicrofarade with a reverse current of less than about 1 micro-ampere at about −1.0 volt.

2. A microwave frequency semiconductor device comprising an electrically-insulating envelope, a pair of lead members coaxially disposed in opposite ends of said envelope, a body of N-type silicon having a resistivity of between 0.01 and 0.015 ohm-centimeter mounted on one of said lead members and in non-rectifying relationship therewith, a whisker of gold-gallium alloy comprising substantially 1% by weight of gallium secured to the other of said lead members and fused to the surface of said N-type silicon body forming a joint comprising a silicon-gold eutectic region and an underlying P-type region, said joint comprising means for producing a capacitive PN-junction between said P-type region and said N-type silicon body of a value less than 0.15 micromicrofarad with a reverse current of less than about 1 micro-ampere at about −1.0 volt.

References Cited by the Examiner

UNITED STATES PATENTS

| | | | |
|---|---|---|---|
| 2,750,654 | 6/56 | Owens | 317—236 |
| 2,776,920 | 1/57 | Dunlap | 317—236 |
| 2,792,538 | 5/57 | Pfann | 317—235 |
| 2,793,332 | 5/57 | Alexander et al. | 317—235 X |
| 2,818,536 | 12/57 | Carman et al. | 317—236 |
| 2,824,269 | 2/58 | Ohl | 317—236 |
| 2,861,230 | 11/58 | Le Loup | 317—236 |
| 2,989,671 | 6/61 | Barnes et al. | 317—235 X |

DAVID J. GALVIN, *Primary Examiner.*

JAMES D. KALLAM, *Examiner.*

UNITED STATES PATENT OFFICE

CERTIFICATE OF CORRECTION

Patent No. 3,196,328 July 20, 1965

Sverre T. Eng

It is hereby certified that error appears in the above numbered patent requiring correction and that the said Letters Patent should read as corrected below.

Column 1, line 25, after "mc." insert a closing parenthesis; line 34, for "39" read -- 38 --; same line 34, after "mc." strike out the comma; column 2, line 11, for "kc," read -- kc. --; line 60, for "techinques" read -- techniques --; line 65, beginning with "nig a low" strike out all to and including "semiconductor de-" in line 67, same column 2; column 4, line 65, for "micromicrofarade" read -- micromicrofarad --.

Signed and sealed this 15th day of March 1966.

(SEAL)

Attest:

ERNEST W. SWIDER
Attesting Officer

EDWARD J. BRENNER
Commissioner of Patents